United States Patent [19]
Park et al.

[11] Patent Number: 5,646,881
[45] Date of Patent: Jul. 8, 1997

[54] SEMICONDUCTOR MEMORY CELL WITH INCREASED REFRESH TIME

[75] Inventors: Yi Hwan Park, Choongchungbook-Do; Hyun Soo Shin, Daejon; Yong-Bok Lee, Seoul, all of Rep. of Korea

[73] Assignee: LG Semicon Co., Ltd., Choongchungbook-Do, Rep. of Korea

[21] Appl. No.: 588,242

[22] Filed: Jan. 18, 1996

[30] Foreign Application Priority Data

Nov. 27, 1995 [KR] Rep. of Korea ............. 43864/1995

[51] Int. Cl.$^6$ ............................................. G11C 11/24
[52] U.S. Cl. ................ 365/149; 365/189.01; 365/189.11
[58] Field of Search .................... 365/149, 189.01, 365/189.11

[56] References Cited

U.S. PATENT DOCUMENTS

| | | | |
|---|---|---|---|
| 4,458,336 | 7/1984 | Takemae | 365/149 |
| 4,581,718 | 4/1986 | Penchuk | 365/203 |
| 4,710,902 | 12/1987 | Pelley, III et al. | 365/222 |
| 5,079,746 | 1/1992 | Sato | 365/149 X |
| 5,184,326 | 2/1993 | Hoffmann et al. | 365/201 |
| 5,317,538 | 5/1994 | Eaton, Jr. | 365/189.09 |
| 5,414,661 | 5/1995 | Ihara | 365/203 |

OTHER PUBLICATIONS

Stanley Wolf, Ph.D., "*Silicon Processing for the VLSI ERA*"; vol. 2; Process Integration; pp. 621–623; 1990.

*Primary Examiner*—David C. Nelms
*Assistant Examiner*—Hien Nguyen

[57] ABSTRACT

In a DRAM cell, as a word line signal is applied to a gate of a MOS transistor, the MOS transistor writes the voltage applied to bit lines BL and $\overline{BL}$ into a capacitor. When a high level data is written, a voltage of the bit line BL or $\overline{BL}$ is increased to be higher than a power supply voltage, so as to permit reading of the data in a stable condition. When a capacitance value of the cell is the same as that of the conventional art, a refresh time of the present semiconductor memory, e.g., DRAM memory, is lengthened over that of the conventional art, whereas when the refresh time is the same as that of the conventional art, the capacitance value used in the present semiconductor memory can be reduced from that of the conventional art.

17 Claims, 3 Drawing Sheets

SEMICONDUCTOR MEMORY CELL WITH INCREASED REFRESH TIME

BACKGROUND OF THE INVENTION

1. Field of the Invention

The present invention relates to a semiconductor memory cell, and more particularly to a semiconductor memory cell in which a potential representing data written at a cell is increased so as to lengthen a refresh time of the cell and to thereby improve its integration.

2. Description of the Prior Art

FIG. 1 shows the construction of a general DRAM cell including a MOS transistor 1 and a capacitor 2. The MOS transistor 1 either writes bit data applied from a bit line BL into the cell by charging the capacitor 2 or reads the data written in the cell by transferring the charge on the capacitor 2 so as to output it to the bit line BL, in accordance with a signal on a word line WL applied to its gate electrode. FIG. 2 shows an operation of the general DRAM cell. In a first cell 1, as a signal on the word line WL1 is applied to the gate electrode of an MOS transistor 11, the MOS transistor 11 writes bit data on the bit line BL into a capacitor 12 or reads the written bit data from the capacitor 12 so as to output it to the bit line BL. In a second cell 2, as a signal on a word line WL2 is applied to the gate electrode of a MOS transistor 21, the MOS transistor 21 writes data of a bit line /BL into a capacitor 22 or reads the data written at the capacitor 22 to output it to the bit line /BL. The data read from a plurality of cells are amplified and output by a sense amplifier 30.

BRIEF DESCRIPTION OF THE DRAWINGS

The present invention will become more fully understood from the detailed description given hereinbelow and the accompanying drawings which are given by way of illustration only, and thus, are not limitative of the present invention, and wherein.

Figure 1:
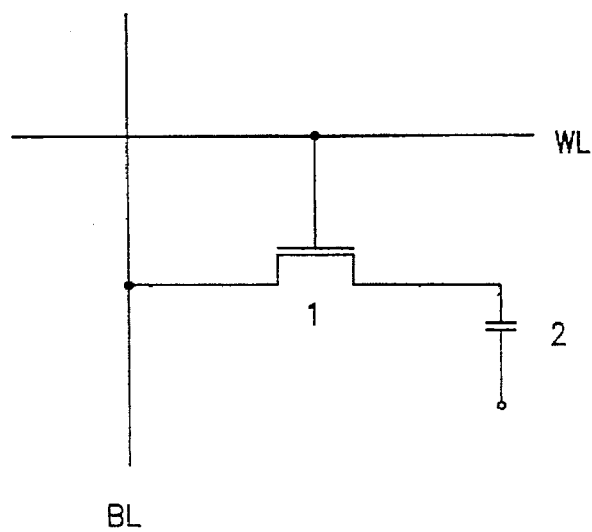
FIG. 1 shows the construction of a general DRAM cell.

The operation of a memory cell of the general DRAM will now be described in detail with reference to FIGS. 1 and 2.

First, in the first cell 1, when the word line WL1 and the bit line BL become high level in order to write the high level data into the cell 1, the MOS transistor 11 is turned on and transmits the high level signal of the bit line BL to the capacitor 12. Then, the capacitor 12 is charged by the high level signal and the potential of a node A becomes high level, so that the high level dater is written into the cell 1. Typically, a power supply voltage Vcc is applied to the bit line, and a slightly higher supply voltage Vcc+α than the power supply voltage Vcc is applied to the word line WL1 so as to prevent a voltage reduction caused due to a threshold voltage Vt. Accordingly, the potential appearing on the node A has the same value as the power supply voltage Vcc applied to the bit line BL. Under this condition, when a potential of the word line WL1 is transitted to a low level, the transistor 11 is turned off, so that the potential at the node A is maintained at a high level.

In the meantime, in order to read the data written in the cell 1, the bit lines BL and /BL are precharged with a potential of ½ Vcc and the potential of the word line WL1 is made to be a high level. In this respect, a voltage $V_{BL}$ appearing on the bit line BL after being read from the cell 1 is expressed by the equation (1) below, where CS is the capacitance of the capacitor 12 of the cell 1 and CB is the capacitance existing at the bit line BL.

$$Q = CV,$$
$$V_{BL}(\text{New}) = Q_T/C_T$$
$$= \frac{1}{2} Vcc + \frac{CS}{CS+CB} \times \frac{1}{2} Vcc - \quad (1)$$

$Q_T = CS \times VA + CB \times V_{BL}(\text{old}) = CS \times Vcc + CB \times \frac{1}{2}Vcc$, $C_T = CS + CB$, VA denotes a potential of the node A, and $V_{BL}(\text{old})$ denotes a potential of the bit line BL in a precharged condition.

As previously described, when data is read, the voltage appearing on the bit line BL is a voltage increased by as much as $CS/(CS+CB) \times \frac{1}{2}$ Vcc more than ½ Vcc over an originally precharged condition. When this increased voltage is inputted to the sense amplifier 30, it is recognized as a high level. In this respect, in order for the data as read to be accurately recognized, the increased voltage, that is, $_\Delta V = CS/(CS+CB) \times \frac{1}{2}$ Vcc must be larger, whereas, in order to make the value $_{66}$ V larger, the values Vcc and CS must be increased while the value CB is made smaller.

However, the biggest problem in the DRAM is not that the voltage of the node A as written at the high level must be constantly maintained at the level Vcc but that the voltage at node A decreases by such an amount so that it can not be recognized as a high level due to the leakage of charge as time passes. Thus, the DRAM needs to perform a refresh operation periodically so as to restore the original voltage level Vcc before the voltage Vcc level written at the cell decreases below a voltage level Vc.

Figure 3:
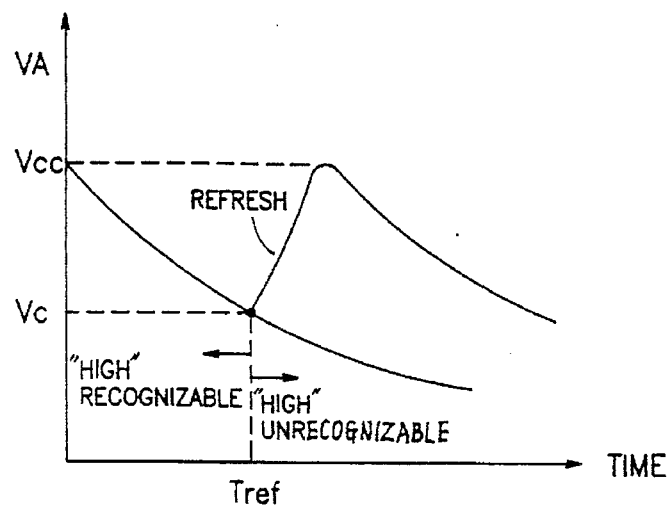
FIG. 3 is a graph showing the refresh time of the DRAM cell.
Figure 4:
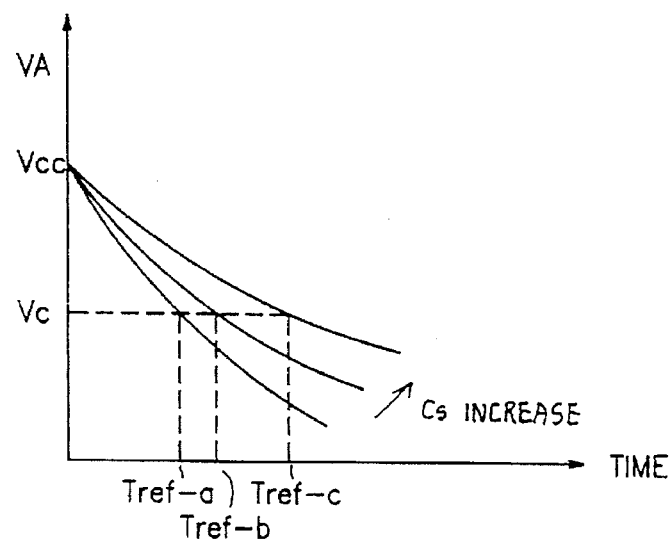
FIG. 4 is a graph showing the refresh time corresponding to the capacitance of the capacitor.

FIG. 3 is a graph showing a refresh time of the DRAM cell. As shown in this figure, the written voltage level gradually decreases from Vcc as time passes, and in this respect, if the time Tref is passed, the written voltage level is decreased below the voltage level Vc which would not be recognized as a high level. Then, when the data is read, the data would not be recognized as being at high level. Therefore, the refresh operation should be performed at least before the time Tref so as to boost the decreasing voltage. Tref represents a refresh time. In addition, for obtaining a longer refresh time, the capacitance value CS of the capacitor 12 should be made larger. FIG. 4 is a graph of refresh time in accordance with the capacitance CS of the capacitor 12. The graph shows that the greater the capacitance CS value is, the longer refresh times Tref-a, Tref-b and Tref-c.

Therefore, in the general DRAM cell, for the purpose of lengthening the refresh time Tref, the capacitance CS value of the cell needs to be increased, which, however, causes a problem in that a size of the cell is inevitably enlarged accordingly.

SUMMARY OF THE INVENTION

Therefore, an object of the present invention is to provide a DRAM cell capable of improving the integration level of a cell in a manner that, by heightening a potential of data written at the DRAM cell when a capacitance value of the cell is the same as that of the conventional art, the refresh time may be lengthened, whereas when the refresh time of the cell is the same as that of the conventional art, its cell size may be reduced.

In order to obtain the above object, there is provided a DRAM cell in which as a word line signal of a predetermined level is applied to a gate of a MOS transistor, the MOS transistor writes data of bit line BL or /BL into a capacitor and reads to output the data written at the capacitor to the bit line BL or /BL, wherein when a high level data is written, a voltage of the bit line BL or /BL is increased above a power supply voltage.

DETAILED DESCRIPTION OF PREFERRED EMBODIMENTS

In the present invention, when the data is written, the voltage of the bit line BL or/$\overline{BL}$ is increased above the level of the power supply voltage, so that when the data is read, a highly increased voltage in comparison with that of the conventional art appears on the bit line BL or/$\overline{BL}$ whereby it is possible to read data in a stable condition. Moreover, in case that the capacitance value of the cell is to be the same as that of the conventional art, a refresh time may be lengthened more than that of the conventional art, whereas in case that the refresh time is to be the same as that of the conventional art, the capacitance value may be reduced less than that of the conventional art.

Figure 2:
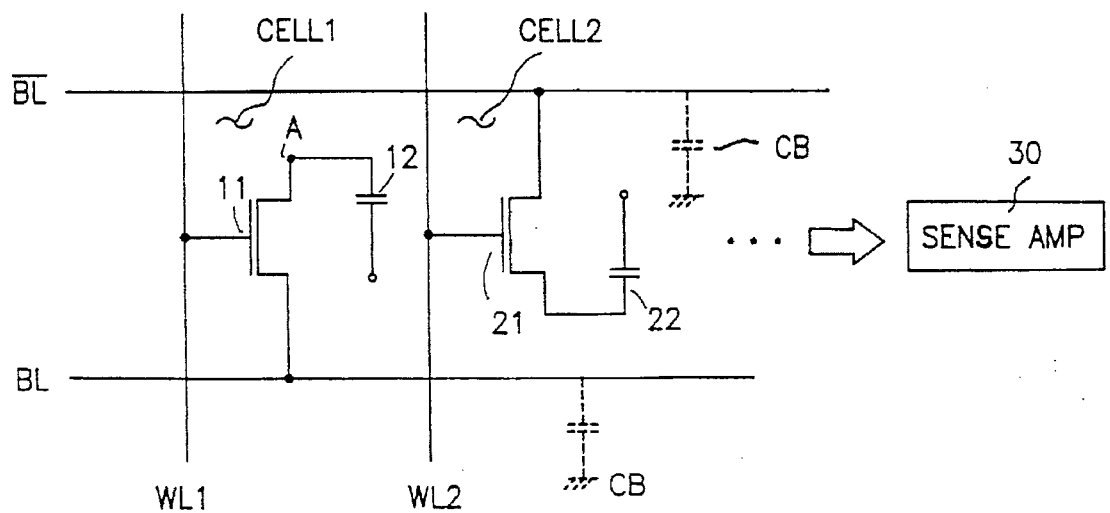
FIG. 2 shows an operation of the general DRAM cell.

The DRAM cell of the present invention has the same construction as that of the general DRAM cell as shown in FIGS. 1 and 2 except that voltages of the bit line BL and the word line WL for writing data at the cell is increased above that in the general DRAM.

That is, in case that a high level data is written at the cell 1, conventionally, the data has been written at the level of the power supply voltage Vcc; however, in the present invention, the data is written by an increased power supply voltage Vcc+$\beta$, for which, the power supply voltage Vcc+$\beta$ is applied to the bit line BL and a power supply voltage Vcc+$\beta$+Vt is applied to the word line WL1 in consideration of the threshold voltage Vt of the MOS transistor 11, so that the voltage Vcc+$\beta$ resultantly appears on the node A.

On the other hand, in order to read the data written at the cell 1, under the condition that the bit lines BL and $\overline{BL}$ are precharged with a potential of ½ Vcc, when the potential of the word line WL1 becomes a high level, a voltage $V_{BL}$ (New) appearing on the bit line BL after being read from the cell 1 is expressed in equation (2) below by the capacitance CS of the capacitor 12 of the cell 1 and the capacitance CB existing at the bit line BL.

$$V_{BL}(\text{New}) = Q_T/C_T$$

$$= \frac{1}{2} Vcc + \frac{CS}{CS+CB} \times \frac{1}{2} Vcc + \frac{CS}{CS+CB}\beta \quad - (2)$$

$Q_T$=CS×VA+CB×$V_{BL}$(Old)=CS×(Vcc+$\beta$)+CB×½Vcc, $C_T$=CS +CB, VA denotes the potential of the node A, and $V_{BL}$ is the potential of the bit line BL in a precharged condition.

In comparing equations (1) and (2), it is noted that the voltage appearing on the bit line BL after being read from the cell in the present invention is increased by as much as (CS/CS+CB)×$\beta$) more than the voltage appearing on the bit line BL after the data is read from the conventional cell. When the increased voltage is applied to the sense amplifier 30, the data can be read in a considerably more stable condition than in the conventional art.

Figure 5:
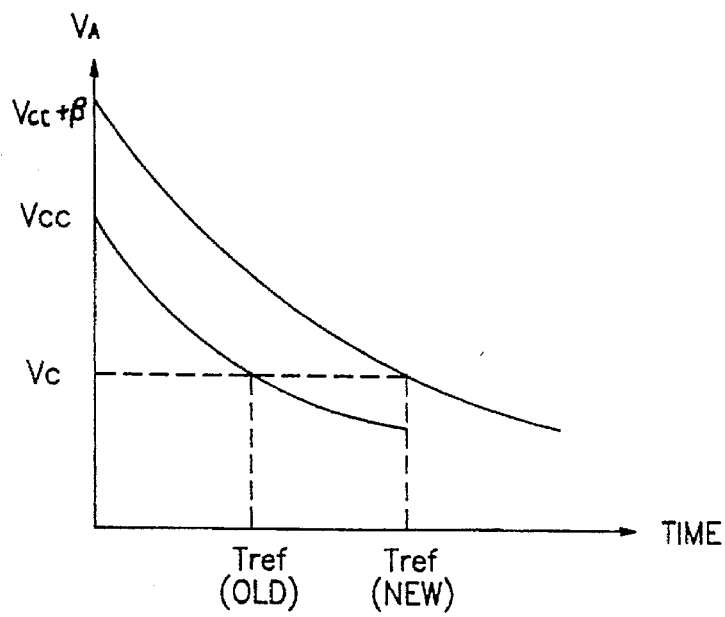
FIG. 5 shows the relationship between the refresh time and the power supply voltage.
Figure 6:
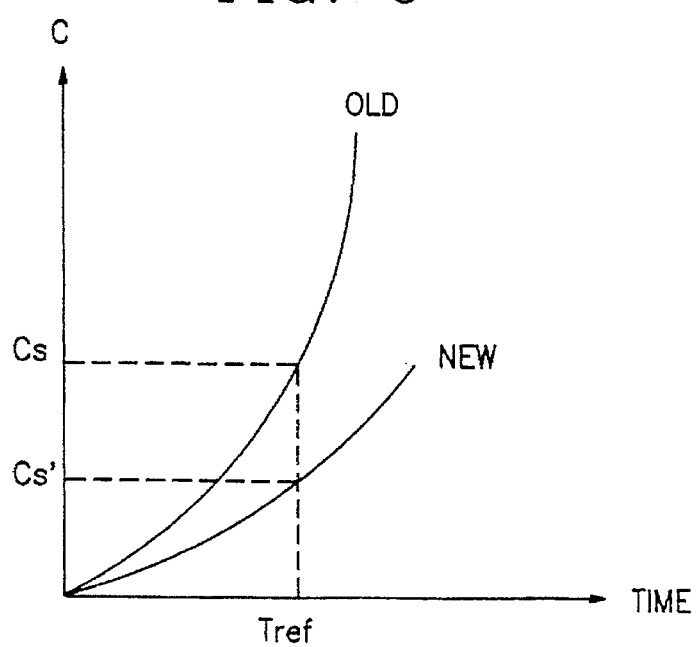
FIG. 6 shows the relationship between the refresh time and the capacitance.

This means that, as shown in FIG. 5, in case that the capacitance value of the cell capacitor 12 is the same as that of the conventional art, the refresh time Tref becomes longer when the potential of the data written at the cell is Vcc+$\beta$ rather than Vcc. Also, it means that, as shown in FIG. 6, a capacitance value CS' of the capacitor 12 can become even smaller than the capacitance CS value of the conventional art, while having the same refresh time Tref.

As so far described, according to the DRAM cell of the present invention, in case that the capacitance value of the cell capacitor is the same as that of the conventional art, the refresh time can be increased to be longer than that of the conventional art, while in case that the refresh time is the same as that of the conventional art, the capacitance value of the cell capacitor can be reduced to be less than that of the conventional art. And, since the reduction of the capacitance of the cell capacitor results in a reduction of the size of the cell capacitor, integration of the cell can be highly improved. Also, when a PMOS transistor is used in place of an NMOS transistor, it is not necessary to apply a high voltage to the word line, thereby further enhancing reliability.

What is claimed is:

1. A semiconductor memory comprising:
   a plurality of MOS transistors;
   a plurality of word lines, each of the word lines being connected to a gate of a corresponding one of the MOS transistors; and
   a plurality of bit lines connected to the MOS transistors, the bit lines receiving a voltage higher than a power supply voltage of the semiconductor memory, such that a refresh time of the semiconductor memory can be increased.

2. A semiconductor memory of claim 1, wherein each of the word lines receives a voltage higher than a sum of the power supply voltage and a threshold voltage of the MOS transistors.

3. A semiconductor memory of claim 1, wherein the plurality of bit lines include at least a first bit line connected to a source of one of the MOS transistors, and a second bit line connected to a drain of another one of the MOS transistors.

4. A semiconductor memory of claim 1, wherein the plurality of MOS transistors form a plurality of DRAM cells.

5. A semiconductor memory of claim 1, further comprising:
   a plurality of capacitors, each of the capacitors being directly connected to either a drain or source of a corresponding one of the MOS transistors.

6. A semiconductor memory of claim 5, wherein applying the voltage higher than the power supply voltage to the bit lines can reduce a size of the capacitors.

7. A semiconductor memory of claim 1, further comprising:
   a sensing amplifier for amplifying signals output from the MOS transistors.

8. A semiconductor memory comprising:
   a plurality of DRAM cells, each of the DRAM cells including a transistor and a capacitor connected to the transistor;
   a plurality of word lines connected to the transistors; and
   a plurality of bit lines connected to the transistors, the bit lines receiving a voltage higher than a power supply voltage of the semiconductor memory, such that a refresh time of the semiconductor memory can be increased.

9. A semiconductor memory of claim 8, wherein each of the word lines receives a voltage higher than a sum of the power supply voltage and a threshold voltage of the transistors.

10. A semiconductor memory of claim 9, wherein the transistors are MOS transistors.

11. A semiconductor memory of claim 10, wherein the plurality of bit lines include at least a first bit line connected to a source of one of the MOS transistors, and a second bit line connected to a drain of another one of the MOS transistors.

12. A semiconductor memory of claim 8, wherein the capacitor is directly connected to either a drain or source of the transistor.

13. A semiconductor memory of claim 8, further comprising:

a sensing amplifier for amplifying signals output from the transistors.

14. A semiconductor memory of claim 8, wherein applying the voltage higher than the power supply voltage to the bit lines can reduce a size of the capacitors of the DRAM cells.

15. A method of operating a semiconductor memory including a plurality of MOS transistors, a plurality of word lines, each of the word lines being connected to a gate of a corresponding one of the MOS transistors, and a plurality of bit lines connected to the MOS transistors, the method comprising the steps of:

supplying a voltage higher than a power supply voltage of the semiconductor memory to the bit lines; and increasing thereby a refresh time of the semiconductor memory.

16. A method of claim 15, further comprising the step of:

supplying a voltage higher than a sum of the power supply voltage and a threshold voltage of the MOS transistors to each of the word lines.

17. A method of claim 16, wherein the plurality of MOS transistors form a plurality of DRAM cells.

* * * * *